(12) United States Patent
Ishikawa et al.

(10) Patent No.: US 7,482,821 B2
(45) Date of Patent: Jan. 27, 2009

(54) PROBE CARD AND THE PRODUCTION METHOD

(75) Inventors: Takaji Ishikawa, Tokyo (JP); Fumio Kurotori, Tokyo (JP); Tadao Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 139 days.

(21) Appl. No.: 11/151,664

(22) Filed: Jun. 14, 2005

(65) Prior Publication Data
US 2005/0280428 A1 Dec. 22, 2005

Related U.S. Application Data

(63) Continuation of application No. PCT/JP2004/002384, filed on Feb. 27, 2004.

(51) Int. Cl.
*G01R 31/02* (2006.01)
(52) U.S. Cl. ...................................... 324/754
(58) Field of Classification Search ................ 324/754, 324/760–762, 765, 158.1
See application file for complete search history.

(56) References Cited

U.S. PATENT DOCUMENTS

| | | | | |
|---|---|---|---|---|
| 5,990,697 A | * | 11/1999 | Kazama | 324/761 |
| 6,005,401 A | * | 12/1999 | Nakata et al. | 324/754 |
| 6,323,667 B1 | * | 11/2001 | Kazama | 324/761 |
| 6,359,452 B1 | * | 3/2002 | Mozzetta | 324/754 |
| 6,489,788 B2 | * | 12/2002 | Sausen | 324/761 |
| 6,636,057 B1 | * | 10/2003 | Uchikura | 324/754 |

FOREIGN PATENT DOCUMENTS

JP   1-184480   7/1989

OTHER PUBLICATIONS

PCT International Search Report dated Jun. 8, 2004 for International Application PCT/JP04/02384.

* cited by examiner

*Primary Examiner*—Ha Tran T Nguyen
*Assistant Examiner*—Tung X Nguyen
(74) *Attorney, Agent, or Firm*—Posz Law Group, PLC

(57) ABSTRACT

A probe card 1 is composed of a plurality of probe pins 50 having wafer-side plungers51 at one end portion and substrate-side plungers52 on the other end side; two probe guides 30 and 40 one above the other for supporting the plurality of probe pins 50, so that the plurality of probe pins 50 are arranged to be corresponding to an arrangement of external terminals of a semiconductor wafer and the wafer-side plungers 51 of the probe pins 50 protrude; a print substrate 10 having pads 13 for the substrate-side plungers 52 of the probe pins 50 supported by the probe guides 30 and 40 to contact; and a stiffener 20 provided on the back surface of the print substrate 10.

2 Claims, 6 Drawing Sheets

PROBE CARD AND THE PRODUCTION METHOD

CROSS REFERENCE TO RELATED APPLICATION

The present application is a continuation application of PCT application no. PCT/JP04/02384, filed on Feb. 27, 2004.

TECHNICAL FIELD

The present invention relates to a probe card capable of conducting a test collectively on each integrated circuit of the semiconductor wafer, which is electrically connected to a test head of a semiconductor wafer testing apparatus and electrically contacts external terminals of the semiconductor wafer, and the production method.

BACKGOUND ART

When producing an electronic device, such as an IC device, having a semiconductor integrated circuit, an operation test of the integrated circuit is normally conducted not only on the electronic device stage (post-step), but on the semiconductor wafer stage (pre-step) to improve the production yields.

A prober was normally used for a test as above, and a probe card provided with a large number of probe pins electrically connected to the test head and a semiconductor wafer to be tested were brought close to electrically contact end portions of probe pins with external terminals of the semiconductor wafer for transferring an electric signal, so that an operation test of the integrated circuit was conducted.

However, the number of integrated circuits on a semiconductor wafer able to be tested by one contact was limited in a conventional probe card, particularly in a probe card using vertical type spring probe pins, so that a plurality of times of contact was necessary to test all integrated circuits on one semiconductor wafer and the test took a long time.

Furthermore, a cost of digital electronic equipments, such as a cellular phone and PDA, has become lower price and, along therewith, demands for a lower price have also become stronger for IC devices, such as flash memory, installed in the digital electronic devices.

To attain high throughput and a low cost in the test, conducting of a test collectively on all integrated circuits on a semiconductor wafer may be considered. However, since semiconductor wafers have become larger to be 8 inches and 12 inches in recent years and integrated circuits have become highly densified, when producing a probe card to deal with such a semiconductor wafer, precision in needle positions of probe pins with respect to external terminals of the semiconductor wafer or connection terminals of a substrate becomes a problem.

DISCLOSURE OF THE INVENTION

The present invention was made in consideration of the above circumstances and has as an object thereof to provide a probe card capable of maintaining high precision in needle positions of probe pins with respect to external terminals of a semiconductor wafer or connection terminals of a substrate, and the production method.

To attain the above object, first, the present invention provides a probe card for collectively testing respective integrated circuits on a semiconductor wafer, the probe card is electrically connected to a test head of a semiconductor wafer testing apparatus and electrically contacts external terminals of the semiconductor wafer, comprising a plurality of probe pins, one end side thereof is a wafer-side probe portion and the other end side thereof is a substrate-side probe portion; a probe guide for supporting said plurality of probe pins, so that said plurality of probe pins are arranged corresponding to an arrangement of the external terminals of the semiconductor wafer and at least the wafer-side probe portions of said probe pins protrude; and a substrate having connection terminals for the substrate-side probe portions of said probe pins supported by said probe guide to contact; wherein said probe guide is composed of a material having substantially the same thermal expansion coefficient (linear thermal expansion coefficient) as that of the semiconductor wafer (invention 1).

In a semiconductor wafer testing apparatus, it is necessary to secure precision in needle point positions of probe card and external terminals of a semiconductor wafer under a variety of test conditions. Particularly when conducting a heat test on a semiconductor wafer, as an example, the semiconductor wafer is heated to a temperature of 85° C. or so, and the probe card is also heated in the same way. Accordingly, when thermal expansion coefficients of the semiconductor wafer and a probe guide for supporting the probe pins are different, a relative positional deviation arises between the external terminals of the semiconductor wafer and the probe pins at heating. The larger a probe area on the probe card is, the larger the positional deviation becomes, which causes a contact error between the probe pins and the external terminals of the semiconductor wafer.

In the probe card of the above invention (invention 1), since the probe guide is composed of a material having substantially the same thermal expansion coefficient as that of the semiconductor wafer, the external terminals of the semiconductor wafer and the probe pins do not cause any positional deviation in the wafer plane direction due to a thermal expansion difference of the semiconductor wafer and the probe guide even in a test under heating.

Second, the present invention a probe card for collectively testing respective integrated circuits on a semiconductor wafer, the probe card is electrically connected to a test head of a semiconductor wafer testing apparatus and electrically contacts external terminals of the semiconductor wafer, comprising a plurality of probe pins having at both end portions a wafer-side probe portion and a substrate-side probe portion respectively biased to the outer directions by an elastic body; a probe guide for supporting said plurality of probe pins, so that said plurality of probe pins are arranged corresponding to an arrangement of the external terminals of the semiconductor wafer and at least the wafer-side probe portions of said probe pins protrude; and a substrate having connection terminals for the substrate-side probe portions of said probe pins supported by said probe guide to contact; wherein said probe guide is fixed to said substrate at a circumferential portion and an inside in the plane direction of said probe guide in a state of biasing the substrate-side probe portions of said probe pins to said substrate side (invention 2).

In the probe card of the above invention (invention 2), since the probe guide biases the substrate-side probe portion of the probe pins to the substrate side, the substrate-side probe portion of the probe pins and connection terminals of the substrate can be electrically connected without fail. Note that when such a configuration is applied, the probe guide is applied with a preload in the opposite direction of the substrate by the probe pins, and when the number of probe pins is large, the preload becomes large to make the probe guide pulled away from the substrate.

In the probe card in the above invention (invention 2), since the probe guide is fixed to the substrate not only at the circumferential portion but also at inside in the plane direction, warps and distortions of the probe guide caused by the preload of the probe pins are prevented and high precision in needle positions of the probe pins with respect to the external terminals of the semiconductor wafer can be maintained.

In the above invention (invention 2), it is preferable that a stiffener is provided on an opposite side of said probe guide on said substrate, and said probe guide is fixed to said substrate and said stiffener (3).

According to the above invention (invention 3), warps and distortions of the probe guide can be more effectively prevented.

In the above invention (invention 3), it is preferable that said probe guide is fixed to said substrate and said stiffener at the inside in the plane direction of said probe guide by a screw inserted from said stiffener side (invention 4).

According to the above invention (invention 4), since the screw occupies the probe guide only exactly by a space of a section area of the shaft portion not of the head portion, it can be applied even when spaces between probe pins are small on the probe guide.

Third, the present invention a probe card for collectively testing respective integrated circuits on a semiconductor wafer, the probe card is electrically connected to a test head of a semiconductor wafer testing apparatus and electrically contacts external terminals of the semiconductor wafer, comprising a plurality of probe pins, one end side thereof is a wafer-side probe portion and the other end side thereof is a substrate-side probe portion; a probe guide for supporting said plurality of probe pins, so that said plurality of probe pins are arranged corresponding to an arrangement of the external terminals of the semiconductor wafer and at least the wafer-side probe portions of said probe pins protrude; and a substrate having connection terminals for the substrate-side probe portions of said probe pins supported by said probe guide to contact; wherein said probe guide is configured by stacking a substrate-side probe guide where the substrate-side probe portions of said probe pins position and a wafer-side probe guide where the wafer-side probe portions of said probe pins position (invention 5).

Fourth, the present invention provides a production method of a probe card for collectively testing respective integrated circuits on a semiconductor wafer, the probe card is electrically connected to a test head of a semiconductor wafer testing apparatus and electrically contacts external terminals of the semiconductor wafer, comprising the steps of fixing a substrate-side probe guide formed with holding holes for holding (including a case of guiding) substrate-side probe portions of probe pins to a substrate having connection terminals for substrate-side probe portions of the probe pins to contact, after aligning the connection terminals of said substrate with the holding holes in said substrate-side probe guide; and stacking a wafer-side probe guide formed with guide holes for guiding the wafer-side probe portions of the probe pins on said substrate-side probe guide and fixing, so that the wafer-side probe portions of the probe pins are inserted to the guide holes in said wafer-side probe guide and the substrate-side probe portions of the probe pins are inserted to the holding holes in said substrate-side probe guide; as a result, arranging and supporting said plurality of probe pins to be corresponding to an arrangement of the external terminals of the semiconductor wafer by said substrate-side probe guide and said wafer-side probe guide (invention 6).

Generally, processing accuracy of the substrate is lower comparing with that of the probe guide and positions of holes formed in the substrate, etc. are not always precise, but according to the above inventions (inventions 5 and 6), the substrate-side probe guide can be fixed to the substrate after visually confirming alignment of holding holes in the substrate-side probe guide and connection terminals of the substrate without disturbed by the probe pins, so that high precision in needle positions of the probe pins with respect to the connection terminals of the substrate can be maintained.

BEST MODE FOR CARRYING OUT THE INVENTION

Figure 1:
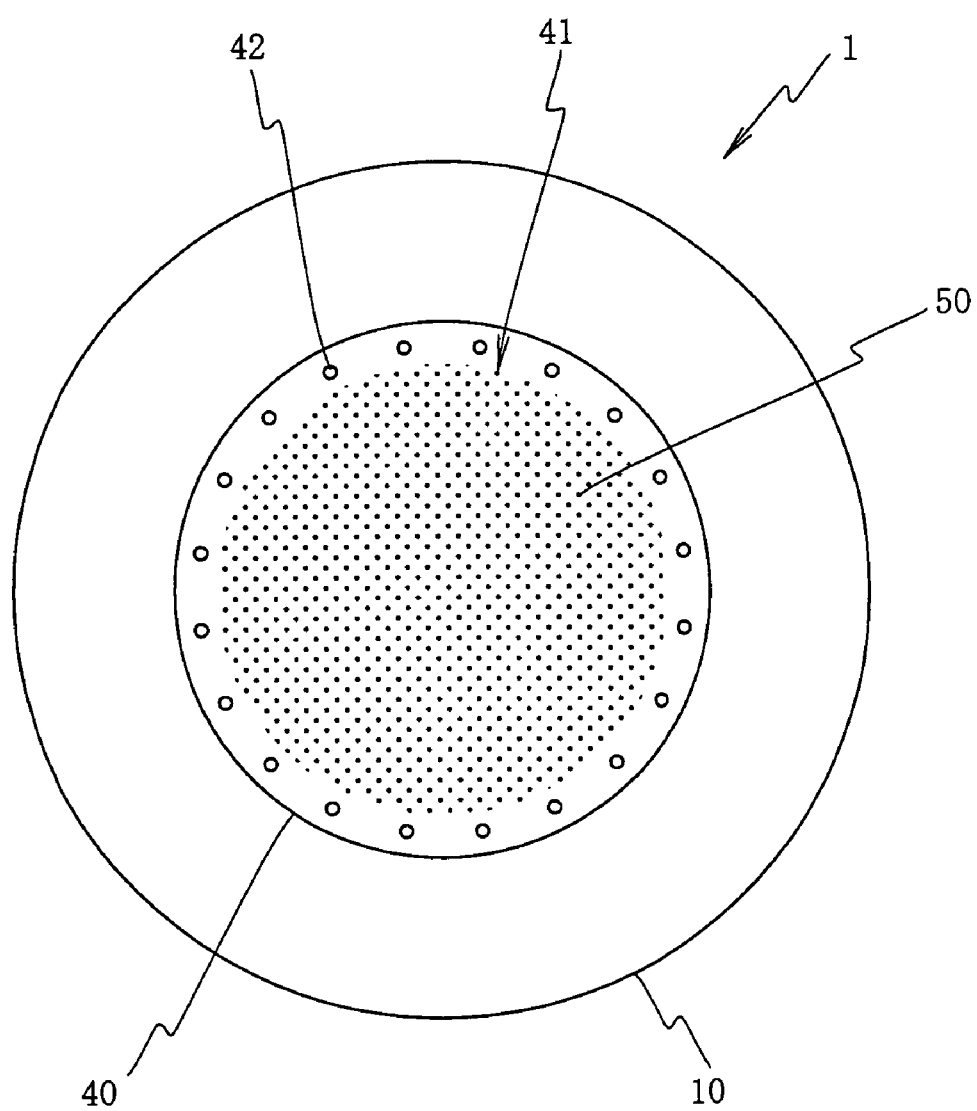
FIG. 1 is a plan view of a probe card according to an embodiment of the present invention.
Figure 2:
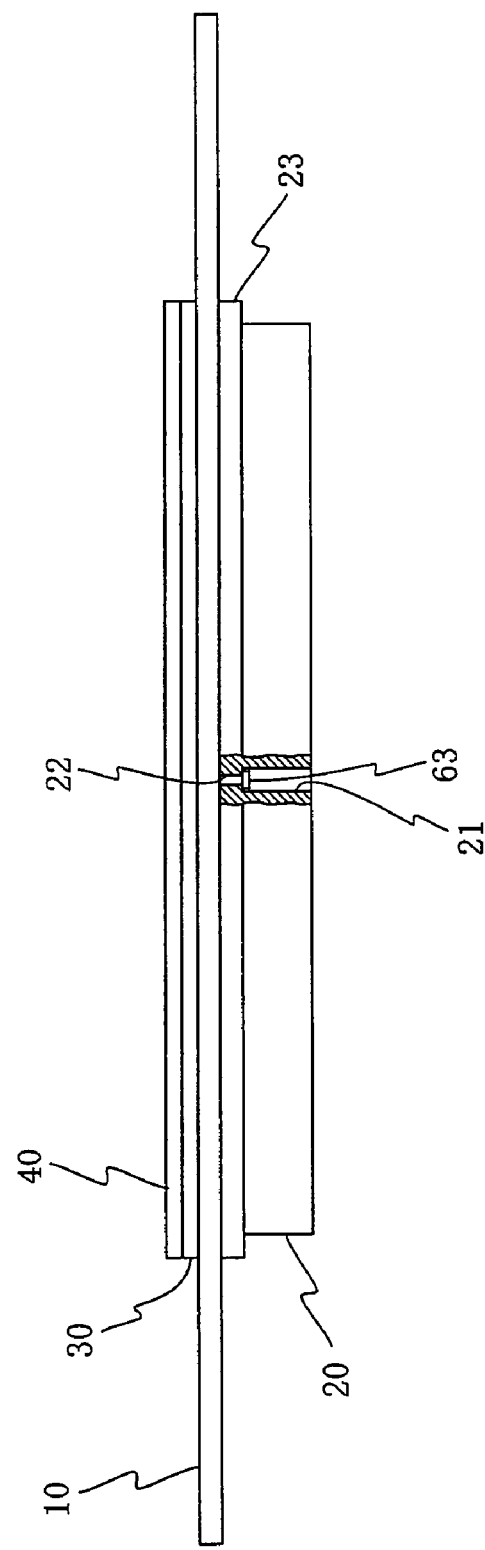
FIG. 2 is a view from the side of the probe card shown in FIG. 1.
Figure 3:
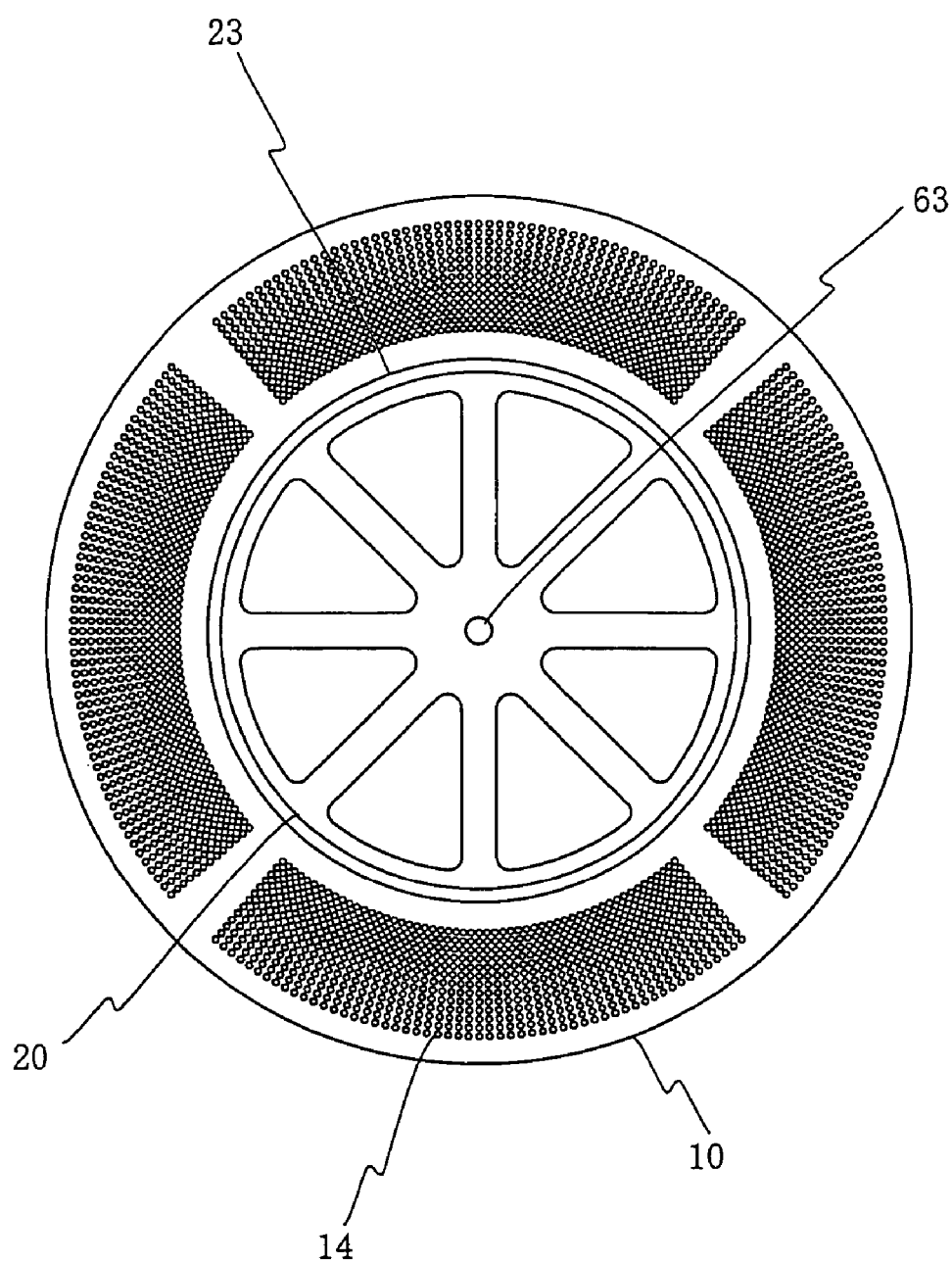
FIG. 3 is a view from the back side of the probe card shown in FIG. 1.
Figure 4:
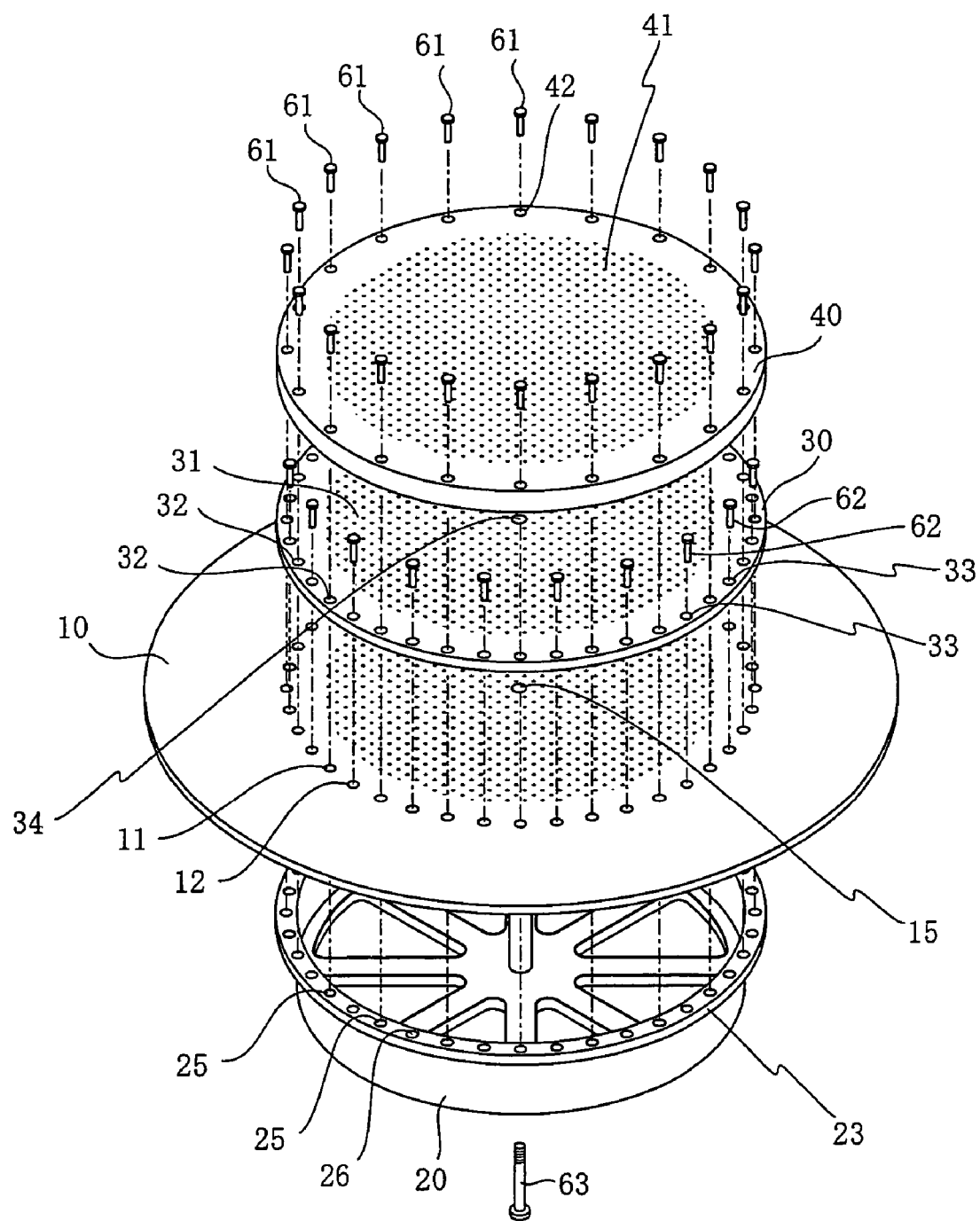
FIG. 4 is a disassembled perspective view showing respective components of the probe card shown in FIG. 1.

Below, a probe card according to an embodiment of the present invention will be explained based on the drawings.

A probe card 1 according to the present embodiment is, as shown in FIG. 1 to FIG. 5, configured by including a print substrate 10, a stiffener 20 provided on the test head side of the print substrate 10, two probe guides 30 and 40 provided one above the other on the opposite side of the test head of the print substrate 10, and a plurality of probe pins 50 supported by the probe guides 30 and 40.

The probe guide 30 is directly arranged on a surface (front surface) on the opposite side of the test head on the print substrate 10 and composes a substrate-side probe guide (hereinafter, "a probe guide 30" will be also referred to as "a substrate-side probe guide 30"). Also, the probe guide 40 is stacked and fixed on the probe guide 30 and composes a wafer-side probe guide (hereinafter, "a probe guide 40" will be also referred to as "a wafer-side probe guide 40").

The probe guides 30 and 40 are formed with probe areas 31 and 41 corresponding to a semiconductor wafer to be tested, and the probe areas 31 and 41 are arranged with a plurality of probe pins 50 corresponding to an arrangement of external terminals of the semiconductor wafer.

On the circumferential portion of the substrate-side probe guide 30, a plurality of through holes 32 for screws 61 to penetrate and a plurality of through holes 33 for screws 62 to penetrate are alternately formed, and one through hole 34 for a screw 63 to penetrate is formed at the center portion of the substrate-side probe guide 30. Also, a plurality of through holes 42 for screws 61 to penetrate are formed at the circumferential portion of the wafer-side probe guide 40, and one screw hole 43 for a screw 63 to screw together is formed at the back side of the center portion of the wafer-side probe guide 40.

The two probe guides 30 and 40 are made, for example, of ceramics, silicone and glass, etc. and, in the present embodiment, they are made of a material having substantially the same thermal expansion coefficient (linear thermal expansion coefficient) as that of the semiconductor wafer to be tested.

The print substrate 10 in the present embodiment has a thin disk shape having a larger diameter than those of the probe guides 30 and 40. A plurality of pads 13 as connection terminals are formed at the center portion of the front surface of the print substrate 10 so as to be corresponding to an arrangement of the external terminals of the semiconductor wafer. Also, connection terminals 14 for transferring electric signals between a test head are formed at an outer circumferential portion on the back surface of the print substrate 10.

At positions on the print substrate 10 corresponding to the through holes 32 and 42 in the probe guides 30 and 40 and the through holes 33 in the probe guide 30, a plurality of through holes 11 for screws 61 to penetrate and a plurality of through holes 12 for screw 62 to penetrate are alternately formed. Also, a through hole 15 for a screw 63 to penetrate is formed at the center portion of the print substrate 10.

The stiffener 20 is provided at the center portion on the back surface of the print substrate 10 and has an approximate dish shape as a whole and the circumferential portion forms a flange portion 23 in the present embodiment. At positions on the flange portion 23 corresponding to the screw holes 32 and 42 in the probe guides 30 and 40 and the screw holes 33 in the probe guide 30, a plurality of screw holes 25 for screws 61 to screw together and a plurality of screw holes 26 for screws 62 to screw together are alternately formed.

Also, at the center portion of the stiffener 20 is formed with a concave portion 21 for housing a head portion of a screw 63 and a through hole 22 for the screw 63 to penetrate.

Next, the probe pins 50 supported by the two probe guides 30 and 40 will be explained.

Figure 5:
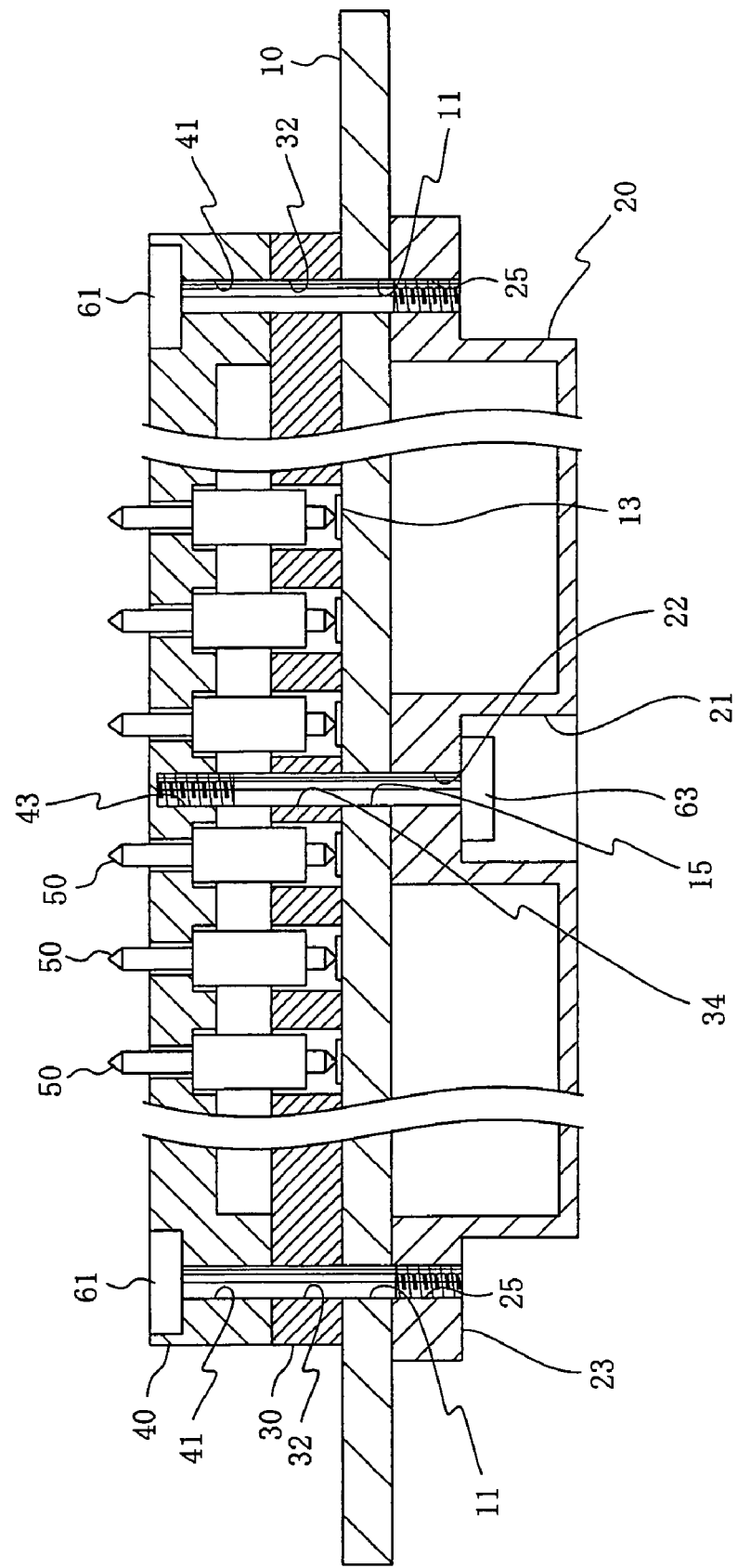
FIG. 5 is a schematic sectional view for explaining the basic configuration of the probe card shown in FIG. 1.
Figure 6:
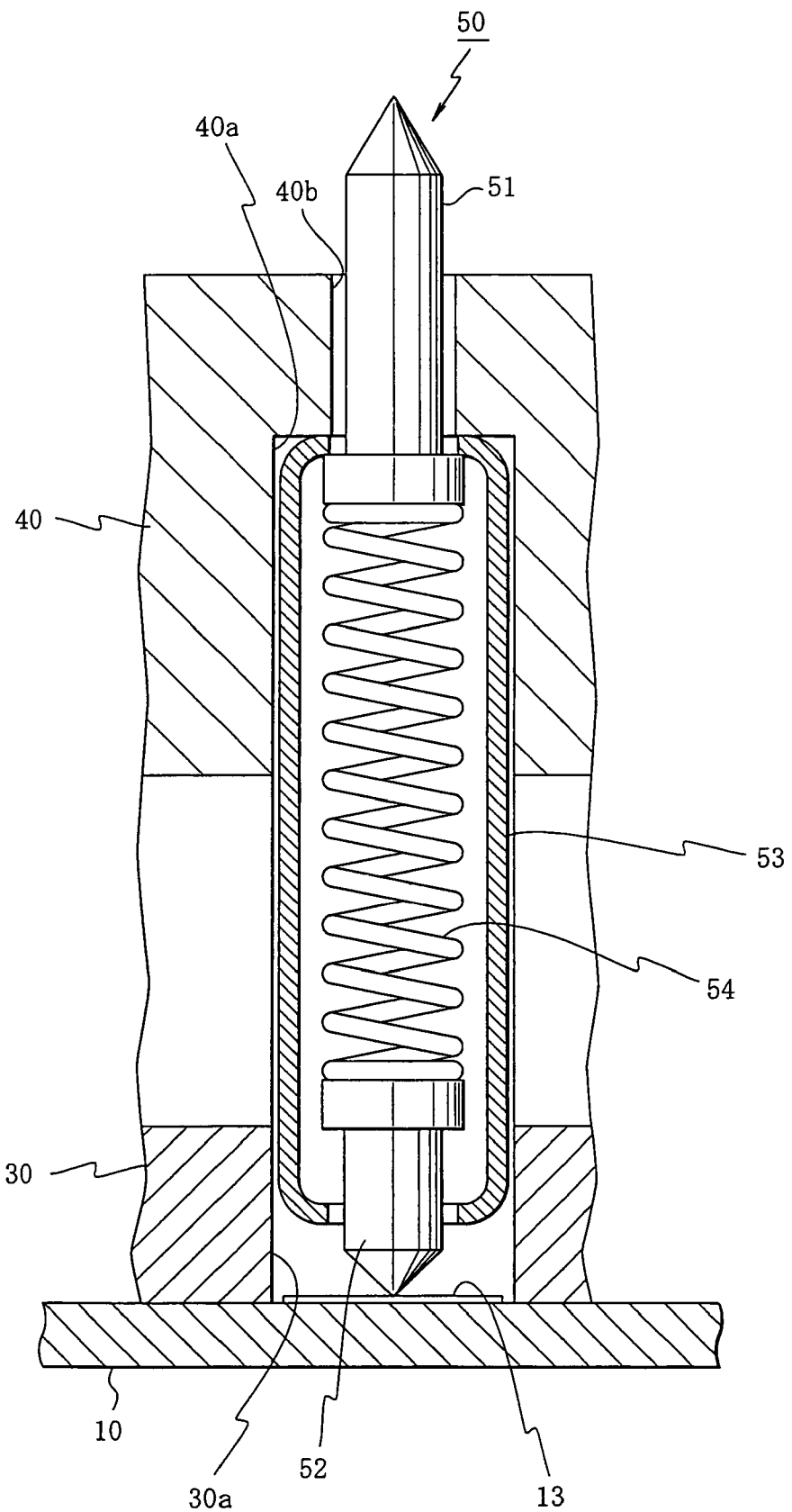
FIG. 6 is a partial sectional view showing an example of the unit configuration of a probe pin.

As the probe pins 50 in the present embodiment, vertical type spring probes (pogo pins) are used as shown in FIG. 5 and FIG. 6.

The probe pins 50 is composed of a cylindrical tube 53, a conductive coil spring 54 held therein, a conductive wafer-side plunger 51 biased to the wafer side by an elastic repulsive force of the coil spring 54 and stopped at the upper end portion of the tube 53, and a conductive substrate-side plunger 52 biased to the substrate side and stopped at the lower end portion of the tube 53.

Such vertical type probe pins 50 themselves can be treated individually by a unit, so that they are excellent for maintenance.

The substrate-side probe guide 30 is formed with a holding hole 30a for supporting the tube 53 of a probe pin 50 and holding the substrate-side plunger 52 such that the holding hole 30a penetrates the substrate-side probe guide 30. Also, the wafer-side probe guide 40 is formed with a supporting hole 40a for supporting the tube 53 of the probe pin 50 and a guide hole 40b for guiding the wafer-side plunger 51 such that the supporting hole 40a penetrates the wafer-side probe guide 40.

The wafer-side plunger 51 of the probe pin 50 protrudes from the guide hole 40b in the wafer-side probe guide 40 by a predetermined amount and capable of receding downwardly due to an elastic repulsive force of the coil spring 54. On the other hand, the substrate-side plunger 52 of the probe pin 50 contacts the pad 13 of the substrate 10 with a predetermined contact pressure due to the elastic repulsive force of the coil spring 54 in a state of being held in the holding hole 30a in the substrate-side probe guide 30.

In this state, the upper end portion of the tube 53 of the probe pin 50 is biased by the elastic repulsive force of the coil spring 54 and contacts the upper end face of the supporting hole 40a in the wafer side probe guide 40. In this way, the wafer-side probe guide 40 is applied with an upward preload by the probe pin 50.

To produce the above probe card 1, the substrate-side probe guide 30 is aligned on the upper surface of the print substrate 10 first. At this time, since the holding hole 30a penetrating the substrate-side probe guide 30 is formed in the substrate-side probe guide 30, the substrate-side probe guide may be aligned so that the pad 13 formed on the print substrate 10 can be seen from the holding hole 30a in the substrate-side probe guide 30.

By inserting the screws 62 to the through holes 33 in the substrate-side probe guide 30 and the through holes 12 in the print substrate 10 and screwing together with the screw holes 26 in the stiffener 20, the substrate-side probe guide 30 is fixed to the print substrate 10 and the stiffener 20.

Next, the wafer-side probe guide 40 is stacked on the substrate-side probe guide 30 so that the wafer-side plungers 51 on the probe pins 50 are inserted to the guide holes 40b in the wafer-side probe guides 40, the tubes 53 of the probe pins 50 are inserted to the supporting holes 40a in the wafer-side probe guides 40, and the substrate-side plungers 52 of the probe pins 50 are inserted to the holding holes 30a in the substrate-side probe guides 30. Then, by inserting the screws 61 to the through holes 42 in the wafer-side probe guide 40, the through holes 32 in the substrate-side probe guide 30 and the through holes 11 in the print substrate 10 to screw with the screw hole 25 in the stiffener 20, inserting the screws 63 to the through holes 22 in the stiffener 20, the through holes 15 in the print substrate 10 and the through holes 34 in the substrate-side probe guide 30 to screw with the screw holes 43 in the wafer-side probe guide 40, the wafer-side probe guide 40 is fixed to the substrate-side probe guide 30, the print substrate 10 and the stiffener 20.

Generally, processing precision of the print substrate 10 is lower than that of the probe guides 30 and 40 and positions of the through holes 32 formed in the print substrate 10 are not always precise, but according to the production method of the probe card 1 as above, the substrate-side probe guide 30 can be fixed to the print substrate 10 after visually confirming alignment of holding holes 30a in the substrate-side probe guide 30 and pads 13 on the print substrate 10 without being disturbed by the probe pins 50, so high precision in needle positions of the probe pins 50 with respect to the pads 13 on the print substrate 10 can be maintained.

Also, in the probe card 1 of the present embodiment, the wafer-side probe guide 40 is fixed to the substrate-side probe guide 30, the print substrate 10 and the stiffener 20 by the screw 63 not only at the circumferential portion but at the center portion being inside in the plane direction. When assuming the case where the wafer-side probe guide 40 is fixed to the substrate-side probe guide 30, the print substrate 10 and the stiffener 20 only at the circumferential portion, it is liable that the center portion of the wafer-side probe guide 40 warps to be pulled away due to a preload by the large number of probe pins 50, however, as a result of being fixed to the substrate-side probe guide 30, the print substrate 10 and the stiffener 20 also at the center portion of the wafer-side probe guide 40 as above, pulling away at the center portion of the wafer-side probe guide 40 is prevented and high precision in needle positions of the probe pins 50 with respect to the external terminals of the semiconductor wafer can be maintained. Such an effect of preventing warps of the wafer-side probe guide 40 becomes more remarkable by reinforcement by the stiffener 20.

Note that the screw 63 to be screwed at the center portion of the wafer-side probe guide 40 is inserted from the stiffener 20 side and occupies the probe guides 30 and 40 only exactly by a space of a section area of the shaft portion not of the head portion, it can be applied even when spaces between probe pins 50 are small on the probe guides 30 and 40.

When conducting a test under heating by using the probe card 1 of the present embodiment, the semiconductor wafer to be tested and the probe guides 30 and 40 expands by the heat, respectively, but the probe guides 30 and 40 are made of a material having substantially the same thermal expansion coefficient as that of the semiconductor wafer, positional deviation in the wafer plane direction is not caused between the external terminals of the semiconductor wafer and the probe pins 50 supported by the probe guides 30 and 40, as a result, the both can be surely brought to contact.

The embodiments explained above are described to facilitate understanding of the present invention and is not to limit the present invention. Accordingly, respective elements disclosed in the above embodiments include all design modifications and equivalents belonging to the technical scope of the present invention.

For example, the probe card 1 does not have to be provided with the stiffener 20, and the probe guides 30 and 40 can be made to be one body. Also, the screw 63 for fixing the probe guides 30 and 40 to the print substrate 10 inside the plane direction may be provided by two or more, provided from the front surface side of the probe guide 40 or omitted.

INDUSTRIAL APPLICABILITY

According to the probe card of the present invention, since high precision in needle positions of the probe pins with respect to the external terminals of the semiconductor wafer or connection terminals of a substrate can be maintained, a plurality of integrated circuits on the semiconductor wafer can be collectively tested without fail and high throughput and a low cost of the test can be attained.

The above probe card of the present invention is effective for conducting a test on a semiconductor wafer by one-time contact, for example, as a pre-processing test on an IC device, such as a flash memory.

The invention claimed is:

1. A probe card for collectively testing respective integrated circuits on a semiconductor wafer, the probe card is electrically connected to a test head of a semiconductor wafer testing apparatus and electrically contacts external terminals of the semiconductor wafer, comprising:

a plurality of probe pins having at both end portions a wafer-side probe portion and a substrate-side probe portion respectively biased to the outer directions by an elastic body;

a probe guide for supporting said plurality of probe pins, so that said plurality of probe pins are arranged corresponding to an arrangement of the external terminals of the semiconductor wafer and at least the wafer-side probe portions of said probe pins protrude; and a substrate having connection terminals for the substrate-side probe portions of said probe pins supported by said probe guide to contact;

wherein said probe guide is fixed to said substrate at a circumferential portion and an inside in the plane direction of said probe guide in a state of biasing the substrate-side probe portions of said probe pins to said substrate side, wherein a stiffener is provided on an opposite side of said probe guide on said substrate, and said probe guide is fixed to said substrate and said stiffener, wherein said stiffener has an approximate dish shape as a whole.

2. A probe card for collectively testing respective integrated circuits on a semiconductor wafer, the probe card is electrically connected to a test head of a semiconductor wafer testing apparatus and electrically contacts external terminals of the semiconductor wafer, comprising:

a plurality of probe pins having at both end portions a wafer-side probe portion and a substrate-side probe portion respectively biased to the outer directions by an elastic body;

a probe guide for supporting said plurality of probe pins, so that said plurality of probe pins are arranged corresponding to an arrangement of the external terminals of the semiconductor wafer and at least the wafer-side probe portions of said probe pins protrude; and a substrate having connection terminals for the substrate-side probe portions of said probe pins supported by said probe guide to contact;

wherein said probe guide is fixed to said substrate at a circumferential portion and a center portion of said probe guide by screws in a state of biasing the substrate-side probe portions of said probe pins to said substrate side, wherein the screws are provided at the circumferential portion and the center portion of said probe guide; and wherein said screw for fixing said probe guide to said substrate at the center portion in the plane direction of said probe guide is inserted from said stiffener side.

* * * * *